(12) United States Patent
Matyuch et al.

(10) Patent No.: US 10,574,100 B2
(45) Date of Patent: Feb. 25, 2020

(54) MAGNETIC CIRCUITS FOR MEMS DEVICES

(71) Applicant: Intel Corporation, Santa Clara, CA (US)

(72) Inventors: Konstantin Matyuch, Petach Tiqva (IL); Barak Freedman, Yokneam (IL); Vladimir Malamud, Hedera (IL); Arnon Hirshberg, D.N Misgav (IL); Israel Petronius, Haifa (IL)

(73) Assignee: Intel Corporation, Santa Clara, CA (US)

( * ) Notice: Subject to any disclaimer, the term of this patent is extended or adjusted under 35 U.S.C. 154(b) by 776 days.

(21) Appl. No.: 15/086,578

(22) Filed: Mar. 31, 2016

(65) Prior Publication Data

US 2017/0288479 A1    Oct. 5, 2017

(51) Int. Cl.
| | |
|---|---|
| *H02K 41/02* | (2006.01) |
| *H02K 1/17* | (2006.01) |
| *H02K 11/30* | (2016.01) |
| *B81B 7/02* | (2006.01) |
| *G02B 26/08* | (2006.01) |
| *H02K 15/03* | (2006.01) |
| *H02K 15/12* | (2006.01) |

(52) U.S. Cl.
CPC ............... *H02K 1/17* (2013.01); *B81B 7/02* (2013.01); *G02B 26/085* (2013.01); *H02K 11/30* (2016.01); *H02K 15/03* (2013.01); *H02K 15/12* (2013.01)

(58) Field of Classification Search
CPC .......... H02K 1/17; H02K 15/12; H02K 11/30; H02K 15/03; B81B 7/02
USPC .......... 310/12.03; 385/140; 29/596; 335/209
See application file for complete search history.

(56) References Cited

U.S. PATENT DOCUMENTS

| | | | |
|---|---|---|---|
| 4,935,080 A * | 6/1990 | Hassell | H01F 41/0253 156/153 |
| 7,829,980 B2 | 11/2010 | Molla et al. | |
| 2002/0050744 A1 * | 5/2002 | Bernstein | B81B 3/0062 310/12.03 |
| 2004/0183382 A1 * | 9/2004 | Delamare | H01F 7/08 310/12.03 |
| 2005/0013580 A1 * | 1/2005 | Yee | G02B 6/266 385/140 |
| 2007/0176719 A1 | 8/2007 | Levitan et al. | |
| 2010/0315938 A1 | 12/2010 | Ascanio et al. | |

FOREIGN PATENT DOCUMENTS

| | | |
|---|---|---|
| CN | 103552976 A | 2/2014 |
| EP | 1950174 B1 | 5/2012 |

OTHER PUBLICATIONS

PCT International Search Report, PCT Application No. PCT/US2017/015038, dated May 8, 2017, 3 pages.

* cited by examiner

*Primary Examiner* — Hanh N Nguyen
(74) *Attorney, Agent, or Firm* — International IP Law Group, P.L.L.C.

(57) ABSTRACT

An example apparatus for produce magnetic fields includes a base plate comprising a plurality of grooves. The apparatus includes an MEMS device disposed on the base plate. The apparatus further includes a number of magnets to produce one or more magnetic fields disposed on the plurality of grooves and adjacent to the MEMS device.

20 Claims, 5 Drawing Sheets

100

200

300

400

MAGNETIC CIRCUITS FOR MEMS DEVICES

TECHNICAL FIELD

The present techniques relate generally to magnetic circuits. More particularly, the present techniques relate to improving magnetic circuit assemblies, such as those used in electromagnetic micro-electromechanical system (MEMS) devices.

BACKGROUND ART

Micro-electromechanical system (MEMS) devices are widely used as actuators, including magnetic actuators. Most magnetic actuators are based on electromagnetic force, which acts on a conductor with current running across a magnetic field. These actuators may include a magnetic circuit to produce the magnetic field and an electric circuit to harvest the electromagnetic force by running a current through an electromagnetic device. Typically, magnetic actuators may be realized using permanent magnets to create the magnetic field and use a conductor coil to run current and displace the actuating element according to the applied electromagnetic force. These permanent magnets are typically disposed around the MEMS device.

BRIEF DESCRIPTION OF DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DETAILED DESCRIPTION

As described above, MEMS device may include a magnetic circuit including a number of magnets surrounding the MEMS device to produce a magnetic field. However, using adhesives to retain one or more magnets of the magnetic circuit to a base plate including the MEMS device may result in movement of the magnets that can affect the magnetic field between the base plate and the magnet. For example, applying adhesive at the edge between a magnet and a base plate may result in a hinge being formed that causes the magnet to move from its original location. Thus, the magnetic field may be affected by the movement of the magnet. In particular, because the small size of MEMS devices and the associated magnetic circuits, any small displacement of a magnet during manufacture from a designed magnetic circuit placement may cause disruption to the operation MEMS device. For example, any minor displacement or rotation of one of the magnets may disrupt the normal operation of the MEMS device.

The present techniques relate generally to magnetic circuits used in electromagnetic devices. The techniques relate to the use of a base plate with a plurality of grooves to be used to retain one or more magnets. The techniques enable the one or more magnets to be retained without any effect on the magnetic field in the magnetic circuit. Embodiments include the use of fast curing adhesives. For example, UV curing adhesives or dual curing adhesives may be used. Thus, the present techniques enable increased curing times that may reduce potential movement of the magnets that could have an effect on the magnetic field. Furthermore, the present techniques improve manufacturing throughput and reliability of the magnet's attachment without any effect on the magnet's force with a base plate.

Figure 1:
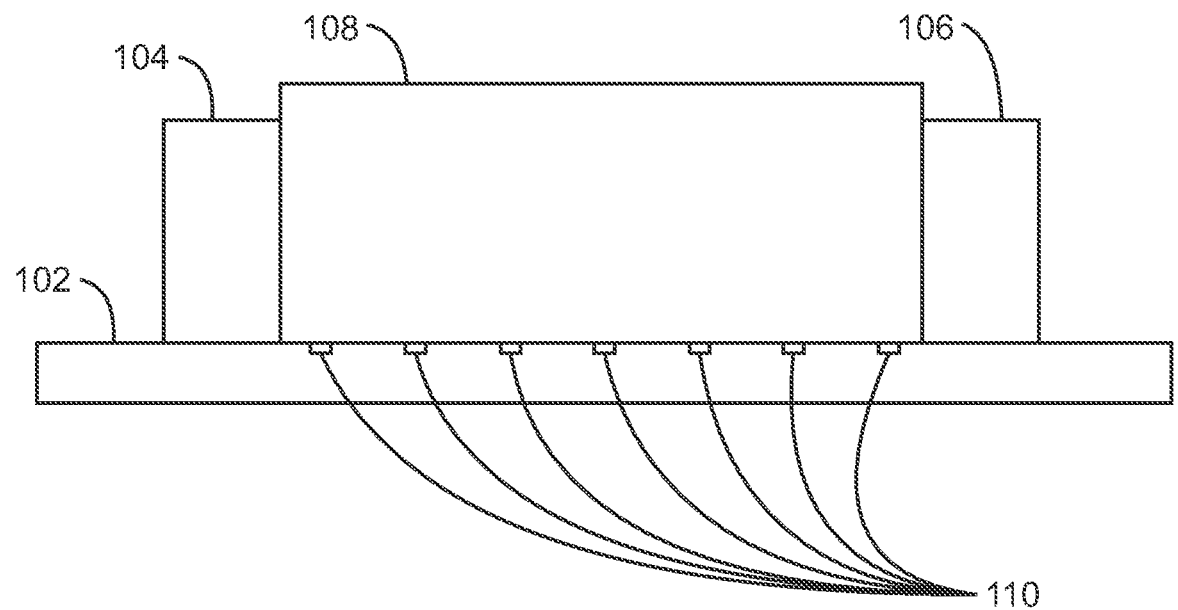
FIG. 1 is a cross sectional side view of an example magnetic circuit.

FIG. 1 is a cross sectional side view of an example magnetic circuit. The example magnetic circuit is generally referred to by the reference number 100 and can be implemented in the computing device 500 of FIG. 5 below.

The example magnetic circuit 100 includes a baseplate 102 and three magnets 104, 106, and 108. The baseplate 102 includes a plurality of grooves 110. For example, the base plate may be a yoke. A yoke, as used herein, refers to any object used to enable the magnetic flux to "flow" between the two or more magnets.

As shown in FIG. 1, the magnet 108 is disposed directed above a plurality of grooves in the base plate 102. For example, the magnet 108 may be retained to the base plate at the plurality of grooves via an adhesive. The magnets 104, 106, 108 are shown directly in contact with the base plate 102. For example, the base plate can include a substantially flat surface. In some examples, the plurality of grooves 110 may be filled with an adhesive to retain the magnet 108 to the base plate 102 as discussed with respect to FIGS. 2-4 below. The groove dimensions can be based on glue viscosity and magnet size. In some examples, the groove dimensions can be from several micro meters to millimeters.

The block diagram of FIG. 1 is not intended to indicate that the magnetic circuit 100 is to include all of the components shown in FIG. 1. Rather, the magnetic circuit 100 can include fewer or additional components not illustrated in FIG. 1, such as additional grooves, additional magnets, and the like. The magnetic circuit 100 may include any number of additional components not shown in FIG. 1, depending on the details of the specific implementation.

Figure 2:
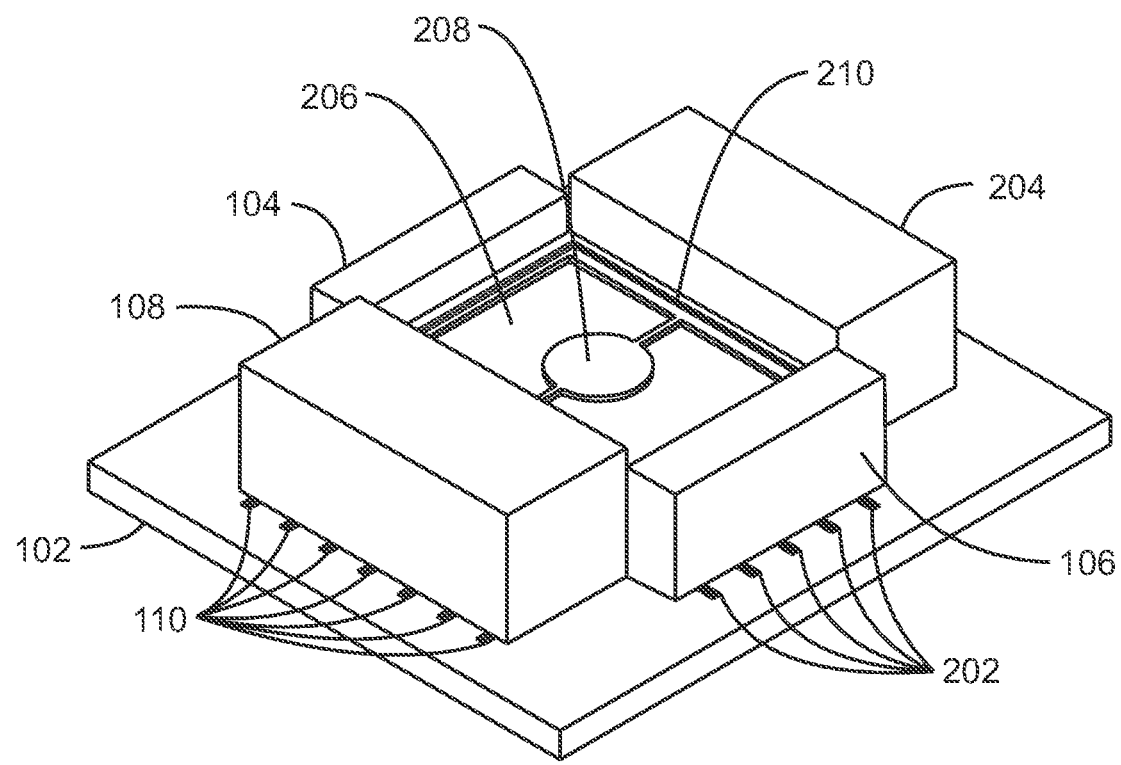
FIG. 2 is a three dimensional view of an example magnetic circuit.

FIG. 2 is a three dimensional view of an example magnetic circuit. The example system is generally referred to by the reference number 200 and can be implemented in the computing device 500 of FIG. 5 below.

The example magnetic circuit 200 includes a second set of grooves 202, a fourth magnet 204, and an electromagnetic device 206, in addition to the elements described in FIG. 1 above.

As shown in FIG. 2, the magnet 106 is also situated above a plurality of grooves 202. Similarly, magnets 104 and 204 are also situated above a plurality of grooves (not shown). Moreover, the four magnets 104, 106, 108, 204 are shown surrounding the electromagnetic device 206. In some examples, the electromagnetic device can be a MEMS device. For example, the MEMS device may include a mirror 208 or other mechanical components that can be adjusted via any suitable electromagnetic techniques. For example, the MEMS device may include a rotor have a substantially rectangular shape and having a driving coil 210 disposed around the rotor. The rotor may be at least partially rotatable around a first axis of the MEMS device, in response to interaction of a first magnetic field that may be provided substantially perpendicular to the first axis, with electric current to pass through the driving coil 210. The MEMS device may further have the mirror 208 disposed about a middle of the rotor, as shown. The mirror 208 may be at least partially rotatable around a second axis coupled with the rotor and disposed substantially orthogonal to the first axis. The mirror 208 may rotate in response to interaction of a second magnetic field that may be provided substantially perpendicular to the second axis, to form a gimbal, with the electric current to pass through the driving coil 210. The mirror 208 may rotate about the second axis, while the rotor may rotate (tilt) about the first axis, thus forming a MEMS device 206 with a 2D movable mirror 208.

In some examples, in order to drive the mirror 208, a magnetic field may be formed by providing two fields, in parallel direction to each of two axes. For example, two perpendicular magnetic fields may be necessary for actuation of the MEMS device 206. In some examples, a magnetic field may be created by a magnetic circuit including magnets 104, 106, 108, 204. When an electric current passes through the driving coil 210, a 2D Lorentz force may cause the mirror 208 to rotate, according to indirect actuation techniques that are known in the art and not discussed herein for reasons of brevity. Thus, any displacement or rotation of the magnets in the magnetic circuit may cause the MEMS device to malfunction. Moreover, the frameless design of the MEMS device 206 shown allows the magnets of the magnetic circuit to be flush with the MEMS device 206.

As also shown in FIG. 2, the length of the grooves 110, 202 can be greater than the width of their associated magnets 108, 106, respectively. This may allow the adhesive to penetrate through the grooves by capillary forces as described in greater detail below. In some examples, the penetration of the adhesive may be managed by preheating the adhesive or modifying the form or depth of the plurality of grooves. In some examples, the penetration of the adhesive may also be managed by selecting an adhesive with a particular thermo-capillarity.

The block diagram of FIG. 2 is not intended to indicate that the magnetic circuit 200 is to include all of the components shown in FIG. 2. Rather, the magnetic circuit 200 can include fewer or additional components not illustrated in FIG. 2, such as additional grooves, additional magnets, and the like. The magnetic circuit 200 may include any number of additional components not shown in FIG. 2, depending on the details of the specific implementation.

Figure 3:
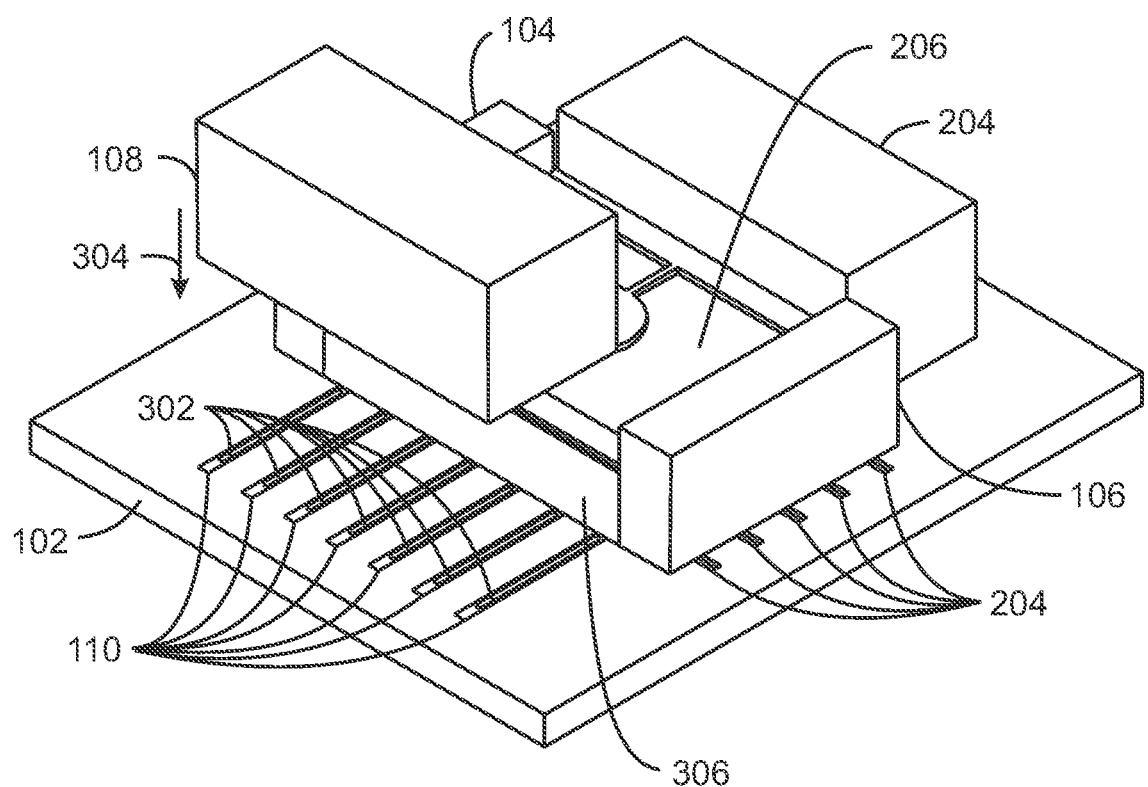
FIG. 3 is a three dimensional view of an example magnetic circuit with a magnet raised to show a number of underlying grooves.

FIG. 3 is a three dimensional view of an example magnetic circuit with a magnet raised to show a number of underlying grooves. The example magnetic circuit is generally referred to by the reference number 300. The magnetic circuit can be implemented in the computing device 500 of FIG. 5 below.

The example magnetic circuit 300 includes an applied adhesive 302 and an arrow 304 indicating the direction of installation of the magnet 108 onto the plurality of grooves 110, and a base 306, in addition to the elements described in FIGS. 1 and 2 above. In some examples, the rotor may be coupled with a base 306 as shown in FIG. 3 below. For example, the rotor may be anchored by the axis to one or more pillars (not shown) that may rest on (e.g., bonded to) the base 306. The pillars may have, for example, a square or rectangular shape. The base 306 may include a substantially flat surface, and may be a part of the MEMS device 206 made of silicon.

As shown in FIG. 3, an adhesive 302 may be applied to grooves 110 before the installation 304 of the magnet 108. In some examples, the adhesive may have a predetermined thermo-capillarity and thus a preheating of the adhesive can be used to control the penetration of the adhesive through the grooves 110. In some examples, the force of the installation 304 of the magnet 108 onto the grooves 110 may cause the adhesive 302 to flow outwards from the electromagnetic device 206. In some examples, any excess adhesive may be wiped from the exposed portions of the grooves 110.

In some examples, the adhesive 302 may be applied to the grooves after the magnet 108 is placed upon the grooves 110. For example, the adhesive may be forced into the grooves 110 under the magnet 108 via a capillary force. In some examples, the adhesive may be preheat to control the flow of the adhesive through the grooves 110.

In some examples, after the adhesive is applied, the adhesive may then be cured. The adhesive 302 can be a UV curing adhesive or a dual curing adhesive, among other suitable adhesives. For example, a UV light applied to the adhesive for a predetermined amount of time may cause the adhesive to cure and retain the magnet to the base plate 102. In some examples, any combination of light, heat, and chemical reaction with air or moisture may be used to cure a dual curing adhesive.

Thus, in this way, the magnet 108 can be attached to the base plate 102 adjacent to the electromagnetic device 206. In some examples, the magnet 108 may be directly in contact with the electromagnetic device 206. In some examples, the magnets 104, 106, 204 may have been similarly installed using the adhesive.

The block diagram of FIG. 3 is not intended to indicate that the magnetic circuit 300 is to include all of the components shown in FIG. 3. Rather, the magnetic circuit 300 can include fewer or additional components not illustrated in FIG. 3, such as additional grooves, additional magnets, and the like. The magnetic circuit 300 may include any number of additional components not shown in FIG. 3, depending on the details of the specific implementation.

Figure 4:
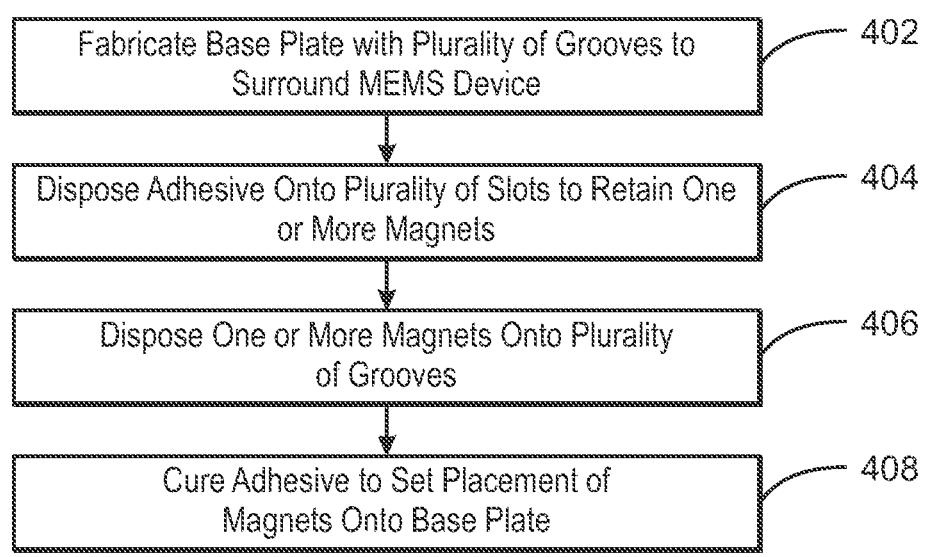
FIG. 4 is block flow diagram of an example method for manufacturing a magnetic circuit.

FIG. 4 is a block flow diagram of another example method for. The example method is generally referred to by the reference number 400. The method can be implemented to manufacture the magnetic circuits 100-300 of FIGS. 1-3 above.

At block 402, a base plate is fabricated with a plurality of grooves to surround an electromagnetic device. For example, the electromagnetic device can be a MEMS device. In some examples, a form and a depth of the plurality of grooves is based at least in part on the adhesive to be applied. In some examples, the base plate may be a yoke. In some examples, the grooves may be formed in the base plate using laser etching, chemical etching, electro-erosion etching, or any other suitable method.

At block 404, an adhesive is disposed onto the plurality of grooves to retain one or more magnets. For example, the adhesive may be a UV adhesive. In some examples, disposing the adhesive may include preheating the adhesive to a predetermined temperature.

At block 406, one or more magnets are disposed onto the plurality of grooves. For example, each magnet may be disposed across a plurality of grooves in the base plate surface and adjacent to the electromagnetic device.

At block 408, the adhesive is cured to set a placement of the magnets onto the base plate. For example, the adhesive can be cured via an ultraviolet (UV) light. In some examples, the adhesive can be cured via a dual curing including light, heat, chemical reaction, or any combination thereof. The adhesive may thus be a fast curing adhesive that minimizes the possibility of the magnets moving out of their initial placement on the base plate.

This process flow diagram is not intended to indicate that the blocks of the example method 400 are to be executed in any particular order, or that all of the blocks are to be included in every case. For example, disposing the adhesive at block 404 may include forcing the adhesive into the plurality of grooves under each of the plurality of magnets via a capillary force after disposing the plurality of magnets onto the plurality of grooves at block 406. Thus, in some examples, block 406 may be performed before block 404. Further, any number of additional blocks not shown may be included within the example method 400, depending on the details of the specific implementation.

Figure 5:
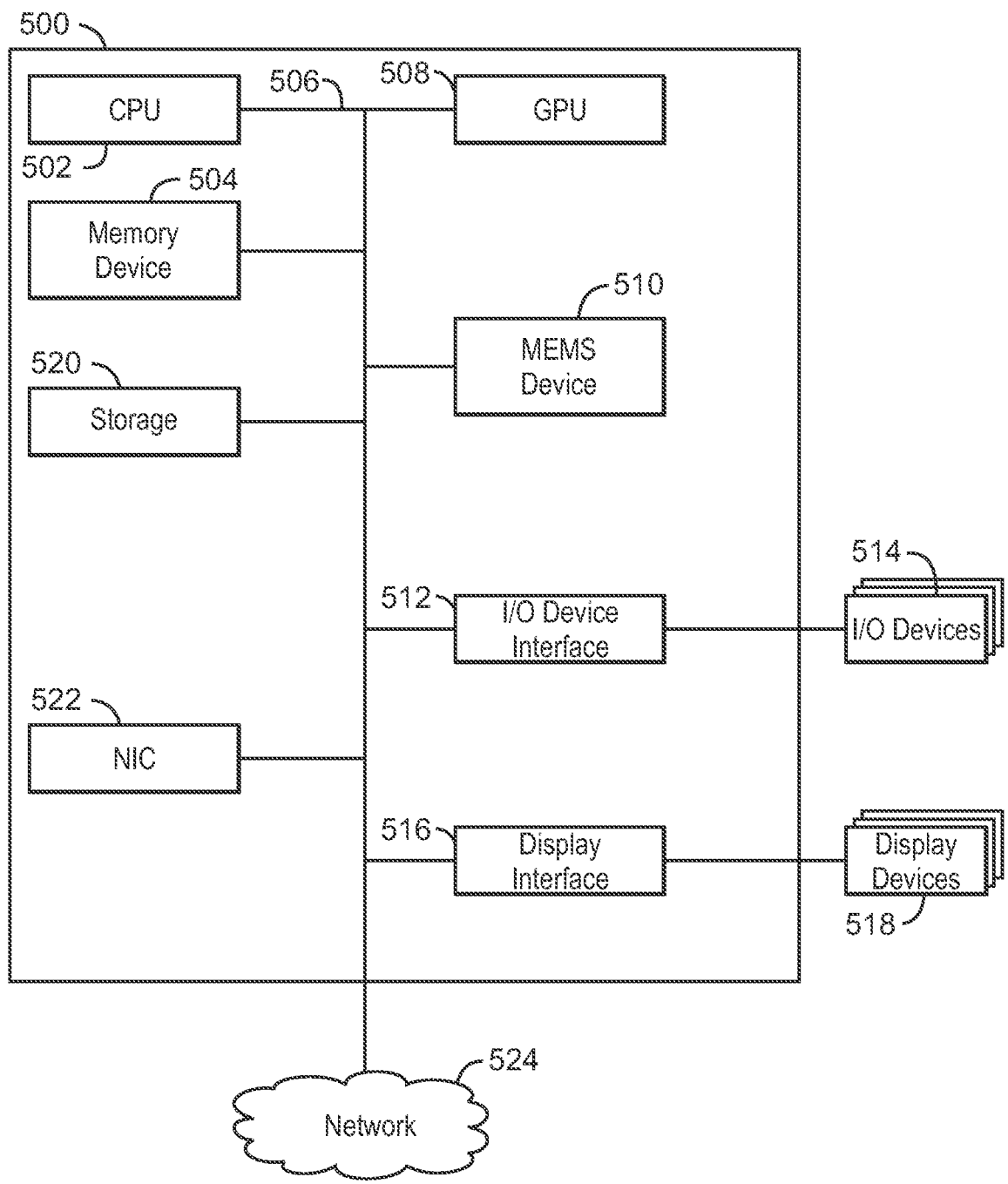
FIG. 5 is a block diagram illustrating an example computing device that may include electromagnetic devices with magnet circuits.

FIG. 5 is a block diagram illustrating an example computing device that may include an electromagnetic device with a magnet circuit. The computing device 500 may be, for example, a laptop computer, desktop computer, or server, among others. The computing device 500 may include a central processing unit (CPU) 502 that is configured to execute stored instructions, as well as a memory device 504 that stores instructions that are executable by the CPU 502. The CPU 502 and the memory device may be coupled to a bus 506. The CPU 502 and the memory device 504 can be coupled together via the bus 506. Additionally, the CPU 502 can be a single core processor, a multi-core processor, a computing cluster, or any number of other configurations. Furthermore, the computing device 500 may include more than one CPU 502. The memory device 504 can include random access memory (RAM), read only memory (ROM), flash memory, or any other suitable memory systems. For example, the memory device 504 may include dynamic random access memory (DRAM).

The computing device 500 may also include a graphics processing unit (GPU) 510. As shown, the CPU 502 may be coupled through the bus 506 to the GPU 508. The GPU 508 may be configured to perform any number of graphics operations within the computing device 500. For example, the GPU 508 may be configured to render or manipulate graphics images, graphics frames, videos, or the like, to be displayed to a user of the computing device 500.

The computing device 500 may also include an electromechanical system (MEMS) device 510. For example, the MEMS device may be used as a magnetic actuator and may include a magnetic circuit to produce a magnetic field. The magnetic circuit may include any number of magnets. In some examples, the magnets may be coupled to a base plate according to the techniques described in FIGS. 1-4 above. For example, the magnets can be disposed to be flush with the base plate and a MEMS device, while coupled to the base plate via any suitable adhesive at the grooves described above. Thus, the base plate may function as a yoke for the magnets and the MEMS device. In some examples, the MEMs device 510 may be any magnetic MEMS actuator or sensor, including a scanning mirror, a rate gyro, an accelerometer, an energy harvesting generator, a speaker, or a microphone, among other possible MEMS devices.

The CPU 502 may also be connected through the bus 506 to an input/output (I/O) device interface 512 configured to connect the computing device 500 to one or more I/O devices 514. The I/O devices 514 may include, for example, a keyboard and a pointing device, wherein the pointing device may include a touchpad or a touchscreen, among others. The I/O devices 514 may be built-in components of the computing device 500, or may be devices that are externally connected to the computing device 500. In some examples, the memory 504 may be communicatively coupled to I/O devices 514 through direct memory access (DMA).

The CPU 502 may also be linked through the bus 506 to a display interface 516 configured to connect the computing device 500 to display devices 518. The display devices 518 may include a display screen that is a built-in component of the computing device 500. The display devices 518 may also include a computer monitor, television, or projector, among others, that is internal to or externally connected to the computing device 500.

The computing device also includes a storage device 520. The storage device 520 is a physical memory such as a hard drive, an optical drive, a thumbdrive, an array of drives, or any combinations thereof. The storage device 520 may also include remote storage drives. The computing device 500 may also include a network interface controller (NIC) 522 that may be configured to connect the computing device 500 through the bus 506 to a network 524. The network 524 may be a wide area network (WAN), local area network (LAN), or the Internet, among others. In some examples, the device may communicate with other devices through a wireless technology. For example, Bluetooth® or similar technology may be used to connect with other devices.

The block diagram of FIG. 5 is not intended to indicate that the computing device 500 is to include all of the components shown in FIG. 5. Rather, the computing system 500 can include fewer or additional components not illustrated in FIG. 5, such as sensors, power management integrated circuits, additional network interfaces, additional peripheral devices, and the like. The computing device 500 may include any number of additional components not shown in FIG. 5, depending on the details of the specific implementation.

EXAMPLES

Example 1 is an apparatus for producing magnetic fields. The apparatus includes a base plate including a plurality of grooves. The apparatus also includes a micro-electromechanical system (MEMS) device disposed on the base plate. The apparatus further includes a plurality of magnets to produce one or more magnetic fields disposed on the plurality of grooves and adjacent to the MEMS device.

Example 2 includes the apparatus of example 1, including or excluding optional features. In this example, the plurality of magnets are to be retained to the base at the plurality of grooves via an adhesive.

Example 3 includes the apparatus of any one of examples 1 to 2, including or excluding optional features. In this example, a length of each of the plurality of grooves is to be longer than a width of an associated magnet of the plurality of magnetics to be retained.

Example 4 includes the apparatus of any one of examples 1 to 3, including or excluding optional features. In this example, the plurality of magnets are disposed substantially flush with the base plate and one or more sides of the MEMS magnetic device.

Example 5 includes the apparatus of any one of examples 1 to 4, including or excluding optional features. In this example, the plurality of grooves are disposed perpendicular to edges of the MEMS device.

Example 6 includes the apparatus of any one of examples 1 to 5, including or excluding optional features. In this example, a form of the plurality of grooves is based on an adhesive used to couple the plurality of magnets to the base plate.

Example 7 includes the apparatus of any one of examples 1 to 6, including or excluding optional features. In this example, a depth of the plurality of grooves is based on an adhesive used to couple the plurality of magnets to the base plate.

Example 8 includes the apparatus of any one of examples 1 to 7, including or excluding optional features. In this example, the base plate is a yoke.

Example 9 includes the apparatus of any one of examples 1 to 8, including or excluding optional features. In this example, the plurality of grooves include low depth grooves.

Example 10 includes the apparatus of any one of examples 1 to 9, including or excluding optional features. In this example, the base plate includes a substantially flat surface.

Example 11 is a method for manufacturing a magnetic circuit for a micro-electromechanical system (MEMS) device. The method includes fabricating a base plate with a plurality of grooves to surround the MEMS device. The method also includes disposing an adhesive onto a plurality of grooves to retain one or more magnets of the magnetic circuit. The method further includes disposing the one or more magnets onto the plurality of grooves.

Example 12 includes the method of example 11, including or excluding optional features. In this example, the adhesive includes a UV adhesive.

Example 13 includes the method of any one of examples 11 to 12, including or excluding optional features. In this example, a form and a depth of the plurality of grooves is based at least in part on the adhesive.

Example 14 includes the method of any one of examples 11 to 13, including or excluding optional features. In this example, disposing the adhesive includes forcing the adhesive into the plurality of grooves under each of the plurality of magnets via a capillary force after disposing the plurality of magnets onto the plurality of grooves.

Example 15 includes the method of any one of examples 11 to 14, including or excluding optional features. In this example, disposing the adhesive further includes preheating the adhesive to a predetermined temperature.

Example 16 includes the method of any one of examples 11 to 15, including or excluding optional features. In this example, disposing the one or more magnets is performed before disposing the adhesive onto the plurality of grooves.

Example 17 includes the method of any one of examples 11 to 16, including or excluding optional features. In this example, the method includes curing the adhesive to set a placement of the magnets onto the base plate via a dual curing including light, heat, chemical reaction, or any combination thereof.

Example 18 includes the method of any one of examples 11 to 17, including or excluding optional features. In this example, fabricating the base plate includes etching the grooves via laser etching, chemical etching, electro-erosion etching, or any combination thereof.

Example 19 includes the method of any one of examples 11 to 18, including or excluding optional features. In this example, fabricating the base plate includes etching the grooves via laser etching, chemical etching, electro-erosion etching, or any combination thereof.

Example 20 includes the method of any one of examples 11 to 19, including or excluding optional features. In this example, fabricating the base plate includes etching the grooves via laser etching, chemical etching, electro-erosion etching, or any combination thereof.

Example 21 is a system for producing magnetic fields. The system includes a processor, a base plate including a plurality of grooves. The system also includes a micro-electromechanical system (MEMS) device electrically coupled to the processor and disposed on the base plate. The system further includes a plurality of magnets to produce one or more magnetic fields disposed on the plurality of grooves and adjacent to the MEMS device.

Example 22 includes the system of example 21, including or excluding optional features. In this example, a length of each of the plurality of grooves is to be longer than a width of an associated magnet of the plurality of magnets and wherein the plurality of grooves are disposed perpendicular to edges of the MEMS device.

Example 23 includes the system of any one of examples 21 to 22, including or excluding optional features. In this example, the plurality of magnets are to be retained to the base at the plurality of grooves via an adhesive.

Example 24 includes the system of any one of examples 21 to 23, including or excluding optional features. In this example, a length of each of the plurality of grooves is to be longer than a width of an associated magnet of the plurality of magnetics to be retained.

Example 25 includes the system of any one of examples 21 to 24, including or excluding optional features. In this example, the plurality of magnets are disposed substantially flush with the base plate and one or more sides of the MEMS magnetic device.

Example 26 includes the system of any one of examples 21 to 25, including or excluding optional features. In this example, the plurality of grooves are disposed perpendicular to edges of the MEMS device.

Example 27 includes the system of any one of examples 21 to 26, including or excluding optional features. In this example, a form of the plurality of grooves is based on an adhesive used to couple the plurality of magnets to the base plate.

Example 28 includes the system of any one of examples 21 to 27, including or excluding optional features. In this example, a depth of the plurality of grooves is based on an adhesive used to couple the plurality of magnets to the base plate.

Example 29 includes the system of any one of examples 21 to 28, including or excluding optional features. In this example, the base plate is a yoke.

Example 30 includes the system of any one of examples 21 to 29, including or excluding optional features. In this example, the base plate includes a substantially flat surface.

Example 31 is a system for producing magnetic fields. The system includes means for communicating with a micro-electromechanical system (MEMS) device. The system also includes means for securing the MEMS device. The system further includes means for producing one or more magnetic fields disposed on the plurality of grooves and adjacent to the MEMS device.

Example 32 includes the system of example 31, including or excluding optional features. In this example, a length of each of the plurality of grooves is to be longer than a width of an associated magnet of the plurality of magnets and wherein the plurality of grooves are disposed perpendicular to edges of the MEMS device.

Example 33 includes the system of any one of examples 31 to 32, including or excluding optional features. In this example, the means for producing one or more magnetic fields are to be retained to the means for securing the MEMS device via an adhesive.

Example 34 includes the system of any one of examples 31 to 33, including or excluding optional features. In this example, a length of each of the plurality of grooves is to be longer than a width of an associated magnet of the plurality of magnetics to be retained.

Example 35 includes the system of any one of examples 31 to 34, including or excluding optional features. In this example, the means for producing one or more magnetic fields are disposed substantially flush with the means for securing the MEMS device and one or more sides of the MEMS magnetic device.

Example 36 includes the system of any one of examples 31 to 35, including or excluding optional features. In this example, the means for securing the MEMS device are disposed perpendicular to edges of the MEMS device.

Example 37 includes the system of any one of examples 31 to 36, including or excluding optional features. In this example, a form of the means for securing the MEMS device is based on an adhesive used to couple the means for producing one or more magnetic fields to the means for securing the MEMS device.

Example 38 includes the system of any one of examples 31 to 37, including or excluding optional features. In this example, a depth of the means for securing the MEMS device is based on an adhesive used to couple the means for producing one or more magnetic fields to the means for securing the MEMS device.

Example 39 includes the system of any one of examples 31 to 38, including or excluding optional features. In this example, the means for securing the MEMS device is a yoke.

Example 40 includes the system of any one of examples 31 to 39, including or excluding optional features. In this example, the means for securing the MEMS device includes a substantially flat surface.

An embodiment is an implementation or example. Reference in the specification to "an embodiment", "one embodiment", "some embodiments", "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods described herein or a computer-readable medium. Furthermore, although flow diagrams and/or state diagrams may have been used herein to describe embodiments, the present techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An apparatus for producing magnetic fields, comprising:
    a base plate comprising a plurality of grooves;
    a micro-electromechanical system (MEMS) device disposed on the base plate; and
    a plurality of magnets to produce one or more magnetic fields disposed on the plurality of grooves and adjacent to the MEMS device.

2. The apparatus of claim 1, wherein the plurality of magnets are to be retained to the base plate at the plurality of grooves via an adhesive.

3. The apparatus of claim 1, wherein a length of each of the plurality of grooves is to be longer than a width of an associated magnet of the plurality of magnets to be retained.

4. The apparatus of claim 1, wherein the plurality of magnets are disposed flush with the base plate and one or more sides of the MEMS device.

5. The apparatus of claim 1, wherein the plurality of grooves are disposed perpendicular to edges of the MEMS device.

6. The apparatus of claim 1, wherein a form of the plurality of grooves is based on an adhesive used to couple the plurality of magnets to the base plate.

7. The apparatus of claim 1, wherein a depth of the plurality of grooves is based on an adhesive used to couple the plurality of magnets to the base plate.

8. The apparatus of claim 1, wherein the base plate comprises a yoke.

9. The apparatus of claim 1, wherein the plurality of grooves comprise low depth grooves.

10. The apparatus of claim 1, wherein the base plate comprises a flat surface.

11. A method for manufacturing a magnetic circuit for a micro-electromechanical system (MEMS) device, comprising:
    fabricating a base plate with a plurality of grooves to surround the MEMS device;
    disposing an adhesive onto the plurality of grooves to retain one or more magnets of the magnetic circuit; and
    disposing the one or more magnets onto the plurality of grooves.

12. The method of claim 11, wherein the adhesive comprises a UV adhesive.

13. The method of claim 11, wherein a form and a depth of the plurality of grooves is based at least in part on the adhesive.

14. The method of claim 11, wherein disposing the adhesive comprises forcing the adhesive into the plurality of grooves under each of the one or more magnets via a capillary force after disposing the one or more magnets onto the plurality of grooves.

15. The method of claim 11, wherein disposing the adhesive further comprises preheating the adhesive to a predetermined temperature.

16. The method of claim 11, wherein disposing the one or more magnets is performed before disposing the adhesive onto the plurality of grooves.

17. The method of claim 11, comprising curing the adhesive to set a placement of the one or more magnets onto the base plate via a dual curing comprising light, heat, chemical reaction, or any combination thereof.

18. The method of claim 11, wherein fabricating the base plate comprises etching the grooves via laser etching, chemical etching, electro-erosion etching, or any combination thereof.

19. A system for producing magnetic fields, comprising:
a processor;
a base plate comprising a plurality of grooves;
a micro-electromechanical system (MEMS) device electrically coupled to the processor and disposed on the base plate; and
a plurality of magnets to produce one or more magnetic fields disposed on the plurality of grooves and adjacent to the MEMS device.

20. The system of claim 19, wherein a length of each of the plurality of grooves is to be longer than a width of an associated magnet of the plurality of magnets and wherein the plurality of grooves are disposed perpendicular to edges of the MEMS device.

* * * * *